US010627858B2

(12) United States Patent
Seo et al.

(10) Patent No.: US 10,627,858 B2
(45) Date of Patent: Apr. 21, 2020

(54) ELECTRONIC DEVICE AND METHOD FOR MANUFACTURING HOUSING OF SAME

(71) Applicant: SAMSUNG ELECTRONICS CO., LTD., Suwon-si, Gyeonggi-do (KR)

(72) Inventors: Jae-Il Seo, Suwon-si (KR); Ki-Jae Kim, Seoul (KR); Ji-Hoon Kim, Incheon (KR); Dong-Ik Lee, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/766,151

(22) PCT Filed: Aug. 24, 2016

(86) PCT No.: PCT/KR2016/009385
§ 371 (c)(1),
(2) Date: Apr. 5, 2018

(87) PCT Pub. No.: WO2017/104933
PCT Pub. Date: Jun. 22, 2017

(65) Prior Publication Data
US 2018/0299924 A1    Oct. 18, 2018

(30) Foreign Application Priority Data
Dec. 14, 2015    (KR) .......................... 10-2015-0178412

(51) Int. Cl.
*G06F 1/16*    (2006.01)
*H05K 5/00*    (2006.01)
(Continued)

(52) U.S. Cl.
CPC ........... *G06F 1/1626* (2013.01); *G05B 19/18* (2013.01); *G06F 1/1635* (2013.01);
(Continued)

(58) Field of Classification Search
CPC .... G06F 1/1626; G06F 1/1635; G06F 1/1658; G06F 1/1633
(Continued)

(56) References Cited

U.S. PATENT DOCUMENTS 6,532,152 B1 *  3/2003  White .............. G02F 1/133308
                                                 361/692
2006/0268528 A1    11/2006  Zadesky et al.
(Continued)

FOREIGN PATENT DOCUMENTS

JP    2009-117863    5/2009
KR    10-2010-0026824    3/2010
(Continued)

OTHER PUBLICATIONS

International Search Report for PCT/KR2016/009385, dated Nov. 28, 2016, 5 pages.
(Continued)

*Primary Examiner* — Anthony M Haughton
(74) *Attorney, Agent, or Firm* — Nixon & Vanderhye, P.C.

(57) ABSTRACT

An electronic device, according to various embodiments of the present disclosure, may comprise: a housing comprising a first plate facing a first direction, a second plate facing a second direction opposite the first direction, and a side member having a first thickness in a third direction perpendicular to the first direction, while at least partially enclosing a space between the first plate and the second plate; a display disposed between the first plate and the second plate within the housing; a printed circuit board disposed between the display and the second plate within the housing; and an inner structure disposed between the printed circuit board and the second plate within the housing while having a second thickness in the first direction, wherein the inner structure
(Continued)

may comprise a flat portion extending from the side member and made of the same metal material as the side member, and wherein the maximum value of the first thickness may be greater than the maximum value of the second thickness. The electronic device as above may vary according to the embodiments.

9 Claims, 13 Drawing Sheets

(51) Int. Cl.
    *H05K 7/00*     (2006.01)
    *H05K 5/04*     (2006.01)
    *G05B 19/18*     (2006.01)
    *H04M 1/02*     (2006.01)

(52) U.S. Cl.
    CPC ............ *G06F 1/1658* (2013.01); *H04M 1/02* (2013.01); *H05K 5/0008* (2013.01); *H05K 5/0086* (2013.01); *H05K 5/04* (2013.01)

(58) Field of Classification Search
    USPC .............. 361/679.21–679.3, 679.55, 679.56; 455/575.1–575.9; 349/56–60
    See application file for complete search history.

(56) References Cited

U.S. PATENT DOCUMENTS

| | | |
|---|---|---|
| 2007/0293282 A1 | 12/2007 | Lewis et al. |
| 2009/0005132 A1 | 1/2009 | Ogatsu |
| 2010/0215938 A1 | 8/2010 | Wang et al. |
| 2015/0123857 A1* | 5/2015 | Park ........................ H01Q 1/243 343/702 |

FOREIGN PATENT DOCUMENTS

| | | |
|---|---|---|
| KR | 10-2013-0066854 | 6/2013 |
| KR | 10-2014-0136188 | 11/2014 |
| KR | 10-2014-0142104 | 12/2014 |
| KR | 10-2015-0009033 | 1/2015 |
| KR | 10-2015-0051588 | 5/2015 |
| KR | 10-1569924 | 11/2015 |

OTHER PUBLICATIONS

Written Opinion of the ISA for PCT/KR2016/009385, dated Nov. 28, 2016, 5 pages.
Partial Supplementary Search Report dated Sep. 26, 2018 in counterpart European Patent Application No. 16875875.3.

* cited by examiner

ELECTRONIC DEVICE AND METHOD FOR MANUFACTURING HOUSING OF SAME

CROSS-REFERENCE TO RELATED APPLICATION(S)

This application is the National Phase of PCT International Application No. PCT/KR2016/009385, which was filed on Aug. 24, 2016, which designated the U.S. and claims priority to Korean Patent Application No. 10-2015-0178412, which was filed in the Korean Intellectual Property Office on Dec. 14, 2015, the entire disclosure of each of these applications being incorporated herein by reference.

TECHNICAL FIELD

Various embodiments disclosed herein relate to an electronic device. For example, various embodiments of the present disclosure relate to an electronic device including a case and/or a housing made of a metallic material, and a method of manufacturing the housing of the electronic device.

BACKGROUND ART

Typically, an electronic device means a device that performs a specific function according to a program incorporated therein, such as an electronic scheduler, a portable multimedia reproducer, a mobile communication terminal, a tablet PC, an image/sound device, a desktop/laptop PC, a vehicular navigation system, or the like, including a home appliance. For example, the above-mentioned electronic devices may output information stored therein as sound or an image. As the integration degree of such electronic devices has increased, and super-high speed and large-capacity wireless communication has become popular, various functions have recently been provided in a single mobile communication terminal. For example, various functions, such as an entertainment function (e.g., a game function), a multimedia function (e.g., a music/video reproducing function), a communication and security function for mobile banking or the like, a schedule management function, and an e-wallet function, are integrated in a single electronic device, in addition to a communication function.

By using a metallic material in manufacturing the case and/or the housing that forms the appearance of the electronic device, various circuit devices, or the like can be protected from the external environment and the appearance can be made beautiful.

DETAILED DESCRIPTION OF THE INVENTION

Technical Problem

There may be a limitation on a forming method and a processing method depending on a metallic material. For example, molding various types of cases and/or housings using a die-casting process is easy, but silicon (Si) may be added such that a molten metal has sufficient fluidity, and the silicon-added metal may suffer from a limitation in surface treatment. The surface treatment of the metallic material may enhance a color or luster inherent to the metal or may form a variety of patterns or colors through an anodizing treatment or the like. However, as mentioned above, since it is difficult to perform surface treatment on a silicon-added metallic material, it may be difficult to impart a pattern, a color, and the like.

In processing a metallic material, processing using computerized numerical control (CNC) lathe may be usefully utilized. In manufacturing a case and/or a housing of a miniaturized electronic device such as a mobile communication terminal, it is possible to cut and process a hexahedral block-shaped metal into a desired shape using a CNC lathe, although this process may vary somewhat depending on the shape or size of the case and/or the housing to be manufactured. CNC lathe processing is relatively less restricted in terms of a material, but may increase the manufacturing time and material consumption because material is cut from a metal block larger than the case and/or the housing to be manufactured.

Various embodiments may provide an electronic device having a beautiful appearance by utilizing a metallic material and a method of manufacturing a housing of the electronic device.

Various embodiments may provide an electronic device and a method of manufacturing a housing including a housing made of a metallic material and easily processed and surface-treated.

Various embodiments may provide a method of manufacturing a housing for an electronic device capable of being manufactured from a metallic material and capable of reducing a manufacturing time and material consumption.

Technical Solution

An electronic device according to various embodiments of the present disclosure may include:

a housing including a first plate facing in a first direction, a second plate facing in a second direction opposite the first direction, and a side member having a first thickness in a third direction perpendicular to the first direction, while at least partially enclosing a space between the first plate and the second plate;

a display disposed between the first plate and the second plate within the housing;

a printed circuit board disposed between the display and the second plate within the housing; and an inner structure disposed between the printed circuit board and the second plate within the housing while having a second thickness in the first direction, wherein the inner structure may include a flat portion extending from the side member and made of the same metal material as the side member, and the maximum value of the first thickness may be greater than the maximum value of the second thickness.

According to various embodiments of the present disclosure, an electronic device may include:

a housing including a first plate facing in a first direction, a second plate facing in a second direction opposite the first direction, and a side member at least partially surrounding a space between the first plate and the second plate;

a display disposed between the first plate and the second plate within the housing;

a printed circuit board disposed between the display and the second plate within the housing; and an inner structure disposed between the printed circuit board and the second plate within the housing while having a second thickness in the first direction.

The inner structure may include a first portion extending from the side member and made of the same metallic material as the side member, a plurality of openings formed through the first portion, and a synthetic resin member disposed in at least one of the openings.

The synthetic resin member may include a screw hole extending in the first direction.

A method of manufacturing a housing of an electronic device according to various embodiments of the present disclosure may include:

a pressing operation for forming a first workpiece including a bottom plate and a side wall member formed on an edge of the bottom plate by processing a metal sheet or a metal plate using a press;

a first computerized numerical control (CNC) processing operation for forming a second workpiece by removing a part of a metallic material constituting the first workpiece;

an injection molding operation for forming a third workpiece by forming an injection-molded structure on the second workpiece through insert injection molding; and a second CNC processing operation for forming a housing member by removing a part of the metallic material constituting the third workpiece.

The side wall of the housing member, which is formed by the side wall member, may be formed to have a thickness, which is the same as a thickness of a flat portion of the housing member formed by processing the bottom plate and is larger than a thickness of the flat portion.

Advantageous Effects

In an electronic device and a method of manufacturing a housing thereof according to various embodiments, a metal sheet and/or a metal plate are pressed to roughly form the shape of a case and/or a housing, and then the case and/or the housing is cut through CNC processing so as to obtain a designed shape. Thus, it is possible to reduce a manufacturing time and material consumption in comparison with the case of machining a metallic block. According to one embodiment, since the case and/or the housing are manufactured through a combination of pressing and CNC processing, it is possible to impart a variety of patterns or colors to the external appearance by manufacturing a case and/or a housing using a metal easily subjected to surface treatment, such as aluminum. For example, it is possible to make the external appearance of the electronic device beautiful.

BRIEF DESCRIPTION OF DRAWINGS

The above and other aspects, features and advantages of the present disclosure will be more apparent from the following detailed description taken in conjunction with the accompanying drawings, in which.

MODE FOR CARRYING OUT THE INVENTION

Figure 1:
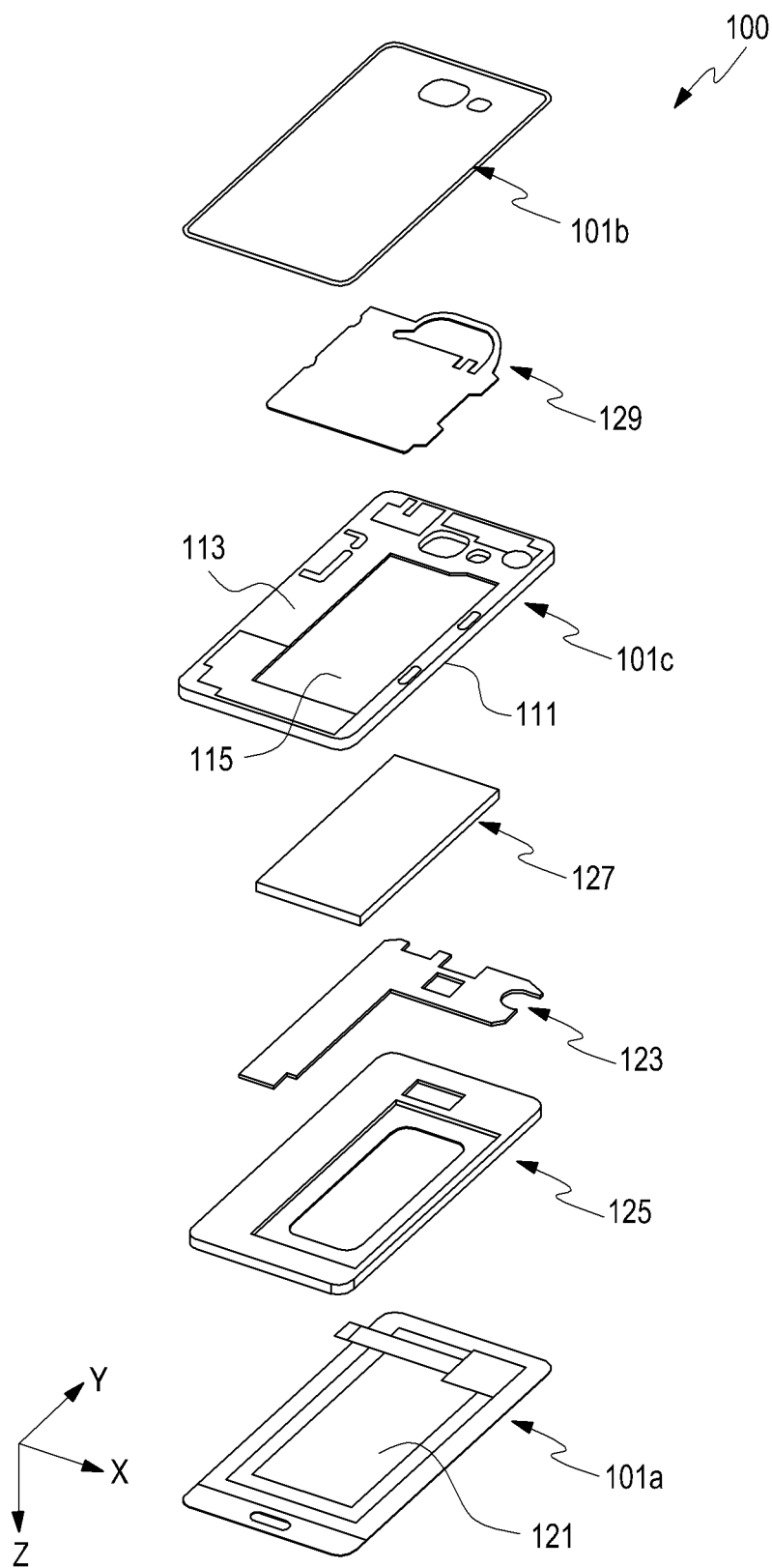
FIG. 1 is an exploded perspective view illustrating an electronic device according to various embodiments.

Hereinafter, various embodiments of the present disclosure will be described with reference to the accompanying drawings. However, it should be understood that there is no intent to limit the present disclosure to the particular forms disclosed herein; rather, the present disclosure should be construed to cover various modifications, equivalents, and/or alternatives of embodiments of the present disclosure. In describing the drawings, similar reference numerals may be used to designate similar constituent elements.

As used herein, the expression "have", "may have", "include", or "may include" refers to the existence of a corresponding feature (e.g., numeral, function, operation, or constituent element such as component), and does not exclude one or more additional features.

In the present disclosure, the expression "A or B", "at least one of A or/and B", or "one or more of A or/and B" may include all possible combinations of the items listed. For example, the expression "A or B", "at least one of A and B", or "at least one of A or B" may include (1) at least one A, (2) at least one B, or (3) both at least one A and at least one B.

The expressions such as "first", "second", or the like used in various embodiments of the present disclosure may modify various elements regardless of order or importance, and do not limit corresponding elements. The above-described expressions may be used to distinguish an element from another element. For example, a first user device and a second user device indicate different user devices although both of them are user devices. For example, a first element may be termed a second element, and similarly, a second element may be termed a first element without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposer between them. In contrast, it may be understood that when an element (e.g., first element) is referred to as being "directly connected," or "directly coupled" to another element (second element), there are no element (e.g., third element) interposed between them.

As used herein, the expression "configured to" may be interchangeably used with the expression "suitable for", "having the capability to", "designed to", "adapted to", "made to", or "capable of". The expression "configured to" may not necessarily mean "specially designed to" in terms of hardware. Alternatively, in some situations, the expression "device configured to" may mean that the device, together with other devices or components, "is able to". For example, the phrase "processor adapted (or configured) to perform A, B, and C" may mean a dedicated processor (e.g., embedded processor) only for performing the corresponding operations or a generic-purpose processor (e.g., central processing unit (CPU) or application processor (AP)) that can perform the corresponding operations by executing one or more software programs stored in a memory device.

The terms used herein are merely for the purpose of describing particular embodiments and are not intended to limit the scope of other embodiments. A singular expression may include a plural expression unless they are definitely different in a context. Unless defined otherwise, all terms used herein, including technical terms and scientific terms, may have the same meaning as commonly understood by a person of ordinary skill in the art to which the present disclosure pertains. Terms, such as those defined in commonly used dictionaries, should be interpreted as having a meaning that is the same or similar to their meaning in the context of the relevant art and will not be interpreted in an idealized or overly formal sense unless expressly so defined herein. In some cases, even the term defined in the present disclosure should not be interpreted to exclude embodiments of the present disclosure.

For example, the electronic device may include at least one of a smartphone, a tablet personal computer (PC), a mobile phone, a video phone, an electronic book (e-book) reader, a desktop PC, a laptop PC, a netbook computer, a personal digital assistant (PDA), a portable multimedia player (PMP), an MP3 player, a mobile medical appliance, a camera, and a wearable device (e.g., a head-mounted-device (HMD) such as electronic glasses, electronic clothes, an electronic bracelet, an electronic necklace, an electronic appcessory, electronic tattoos, or a smart watch).

In some embodiments, an electronic device may be a smart home appliance. The home appliance may include at least one of, for example, a television, a Digital Video Disk (DVD) player, an audio, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to another embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a Vehicle Infotainment Devices, an electronic devices for a ship (e.g., a navigation device for a ship, and a gyro-compass), avionics, security devices, an automotive head unit, a robot for home or industry, an Automatic Teller's Machine (ATM) in banks, Point Of Sales (POS) in a shop, or internet device of things (e.g., a light bulb, various sensors, electric or gas meter, a sprinkler device, a fire alarm, a thermostat, a streetlamp, a toaster, a sporting goods, a hot water tank, a heater, a boiler, etc.).

According to some embodiments, the electronic device may include at least one of a part of furniture or a building/structure, an electronic board, an electronic signature receiving device, a projector, and various kinds of measuring instruments (e.g., a water meter, an electric meter, a gas meter, and a radio wave meter). In various embodiments, the electronic device may be a combination of one or more of the aforementioned various devices. According to some embodiments, the electronic device may also be a flexible device. Further, the electronic device according to an embodiment of the present disclosure is not limited to the aforementioned devices, and may include a new electronic device according to the development of technology.

FIG. 1 is an exploded perspective illustrating an electronic device 100 according to various embodiments of the present disclosure in a disassembled state.

Referring to FIG. 1, an electronic device 100 according to various embodiments includes a housing including a first plate 101a, a second plate 101b, a side member 111, a display 121 accommodated in the housing, and a printed circuit board 123.

The first plate 101a may be disposed to face in a first (Z) direction, for example, toward the front side of the electronic device 100, and may include a window member made of a transparent glass material. The second plate 101b may be disposed to face in a second (−Z) direction opposite the first (Z) direction. In one embodiment, the second plate 101b may be disposed substantially parallel to the first plate 101a with a predetermined distance therebetween. The side member 111 may be provided as a portion of the housing member 101c and may be disposed to at least partially surround the space between the first plate 101a and the second plate 101b. According to one embodiment, the side member 111 may have a first thickness in a third direction (e.g., the X direction and/or the Z direction) perpendicular to the first (Z) direction.

In another embodiment, the side member 111 may have a closed loop shape or a frame shape and may include at least one pair of curved portions. For example, the side member 111 may include four straight or flat plate-shaped side walls and curved portions connecting two adjacent side walls. In one embodiment, at least one pair of curved portions may be arranged symmetrical to each other. For example, based on the center of the electronic device 100 in the longitudinal direction (e.g., the Y direction in FIG. 1) and/or the width direction (e.g., the X direction in FIG. 1), at least one pair of the curved portions may be arranged symmetrical to each other. In another embodiment, at least one pair of curved portions may have shapes that are symmetrical to each other.

According to various embodiments, the first plate 101a and the second plate 101b may be mounted on the front face and the second face of the housing member 101c, respectively. The side member 111 may be positioned at an edge portion of each of the first plate 101a and the second plate 101b. For example, the electronic device 100 may include a housing including the first plate 101a, the second plate 101b, and the side member 111, and the display 121, a circuit board 123, a battery 127, and the like may be disposed within the housing. In one embodiment, the electronic device 100 may include an antenna member 129 disposed between the first plate 101a and the second plate 101b, for example, on the inner face of the second plate 101. The antenna member 129 may include a radiation conductor in which conductors are arranged in a flat coil shape and/or a loop shape, and the electronic device 100 may perform wireless power transmission/reception, near-field communication (NFC), or the like through the antenna member.

According to various embodiments, the display 121 may be disposed between the first plate 101a and the second plate 101b within the housing. For example, the display 121 may be coupled to and/or attached to the inner face of the first plate 101a. In one embodiment, a touch panel may be incorporated in the display 121 and/or the first plate 101a, and an input device may be formed through a combination of the display 121 and the touch panel.

The printed circuit board 123 may be disposed between the display 121 and the second plate 101b within the housing. In one embodiment, a processor, a communication module, a sound module, a power management module, various sensors, and the like may be mounted on the printed circuit board 123. In some embodiments, each of a processor, a communication module, a sound module, a power management module, various sensors, etc., may be provided as a separate integrated circuit chip, or at least two modules (and/or a sensor) may be integrated into one module or integrated circuit chip.

In the electronic device 100, for example, the housing member 101c may include an inner structure 113, for example, a flat portion. The inner structure 113 may have a substantially flat plate shape disposed in the space extending from the inner face of the side member 111 and surrounded by the side member 111 disposed, for example, between the printed circuit board 123 and the second plate 101b. In one embodiment, the inner structure 113 may include an opening 115 formed by removing a portion of the flat portion. For example, the opening 115 may be formed to penetrate the flat portion of the internal structure 113 in the first (Z) direction and/or the second (−Z) direction. According to various embodiments, the opening 115 may accommodate at least a portion of the battery 127.

According to various embodiment, the inner structure 113 may have a second thickness in a first (Z) direction and/or the second (−Z) direction. According to one embodiment, the second thickness may be equal to or smaller than the first thickness. In some embodiments, the measured values of the first thickness or the second thickness may be different according to a measurement position on the side member 111 and/or a measurement position on the inner structure 113. According to various embodiments, the maximum value of the first thickness may be greater than the maximum value of the second thickness. The design of the first thickness and the second thickness as described above may maintain and improve the rigidity of the housing and/or the electronic device 100. For example, by securing the thickness of the side member 111 to a certain extent, it is possible to secure sufficient rigidity to withstand external force such as torsion or the like applied to the housing and/or the electronic device 100. According to various embodiments, the inner structure 113 extending from the side member 111 may also contribute to enhancing the rigidity of the housing and/or the electronic device 100 by supporting the side member 111 in the form of a frame.

According to various embodiments, the inner structure 113 may be made of the same metallic material as the side member 111. For example, the housing member 101c may be provided in the form in which the inner structure 113 is formed integrally with the side member through pressing and/or CNC processing of a metal sheet and/or a metal plate made of an aluminum material.

In one embodiment, the electronic device 100 may further include an intermediate plate 125. The intermediate plate 125 may be disposed between the first plate 101a and the second plate 101b, for example, between the display 121 and the printed circuit board 123. The intermediate plate 125 is able to maintain and improve the rigidity of the housing and/or the electronic device 100. When the intermediate plate 125 is made of a conductive material, the intermediate plate 125 can be used as a shielding member for blocking electromagnetic interference. For example, the intermediate plate 125 may prevent electromagnetic waves generated from an integrated circuit chip(s) disposed on the printed circuit board 123 from interfering with the operation of other integrated circuit chips or the display 121.

Figure 2:
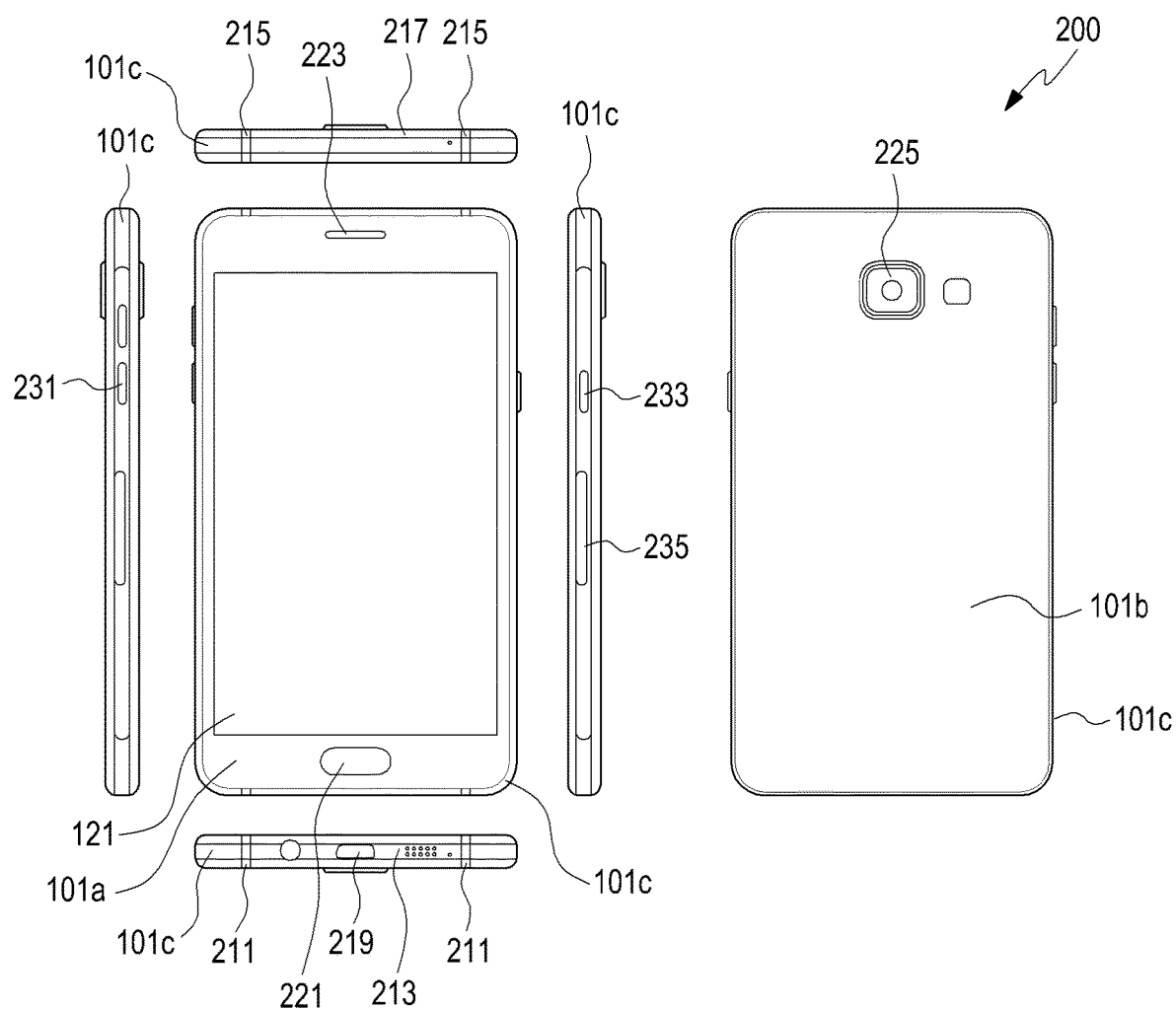
FIG. 2 is a set of six drawings illustrating the electronic device according to various embodiments.

FIG. 2 is a set of six drawings illustrating an electronic device 200 according to various embodiments.

In describing various embodiments below, for the components that can be easily understood through the preceding embodiment, the same reference numerals as those of the preceding embodiment may be given, or the reference numerals components may be omitted, and the detailed descriptions thereof may also be omitted.

Referring to FIG. 2, an electronic device 200 (e.g., electronic device 100 of FIG. 1) according to various embodiments may include a first plate 101a disposed on the front face and a display 121 mounted on the inner face of the first plate 101a. The first plate 101a may visually expose the display 121 (e.g., a screen display region of the display 121 of FIG. 1) to the outside therethrough. For example, the first plate 101a may be made of a transparent glass material in order to expose a screen, which is output through the display 121, therethrough while protecting the display 121. In one embodiment, the electronic device 200 may include input/output devices such as a key 221, a receiver 223, and the like disposed around the display 121 on the front face. In another embodiment, the electronic device 200 may include a camera module 225 disposed on the rear face (e.g., the second plate 101b). The electronic device 200 may image a subject through the camera module 225, and the image of the subject detected through the camera module 225 may be output through the display 121.

At least a portion of the housing member 101c of the electronic device 200 (e.g., the side member 111 described above) may be exposed to a side face of the electronic device 200. A volume control key 231, a power key 233, a slot cover 235, and the like may be disposed on a side face of the electronic device 200. The volume control key 231 or the power key 233 may provide various functions according to the operation mode of the electronic device 200. For example, the volume control key 231 is generally used for volume control but may also be used for activating the camera mode in a sleep mode or moving/selecting icons among the icons output through the display 121. The slot cover 235 may conceal a slot exposed to a side face of the electronic device 200, and may be provided as a tray for mounting a subscriber identification module (SIM) card, an external memory, or the like according to an embodiment of the present disclosure.

For example, at least one of the upper face and the lower face of the housing member 101c of the electronic device 200 may be provided with various connectors. For example, an interface connector 219 for connecting a charging or data cable, an earphone jack, or the like may be disposed on the upper face or the lower face of the electronic device. It is noted that the arrangement of the volume control key 231, the power key 233, and various connectors does not limit the present disclosure. For example, the arrangement of the key, the connector, and the like may vary depending on the external appearance and the utilization form of the electronic device 200.

According to one embodiment, the housing member 101c, for example, the side member 111 of FIG. 1, may be made of an electrically conductive material and a portion thereof may be insulated from the other portions. For example, at least one of the upper face and the lower face of the electronic device 200 may have split portions 211 and 215 extending across the housing member 101c. Here, the "slit portion" may mean a portion that interrupts the continuity of the material constituting the housing member 101c. For example, although the side member 111 described above has a frame shape made of a generally conductive material, some portions of the conductive material portion are cut off so as to form the split portions 211 and 215, and another material, for example, an electrically non-conductive synthetic resin material may be disposed in the split portions 211 and 215. Portions 213 and 217 of the housing member 101c can be electrically insulated from the other portions by the split portions 211 and 215. According to one embodiment, the portion 213 and 217 of the housing member 101c (e.g., the portions electrically insulated from the other portions by the split portions 211 and 215) may form an antenna of the electronic device 200.

The construction for forming the antenna using the housing member 101c is disclosed in Korean Laid-Open Patent No. 10-2015-0051588 (published on May 13, 2015) and US Laid-Open Patent No. US 2015/0123857 (published on May 7, 2015), etc., and thus a detailed description thereof will be omitted. In addition, the structure in which the split portions 211 and 215 or the like are formed will be described in more detail with reference to the following embodiments.

Figure 3:
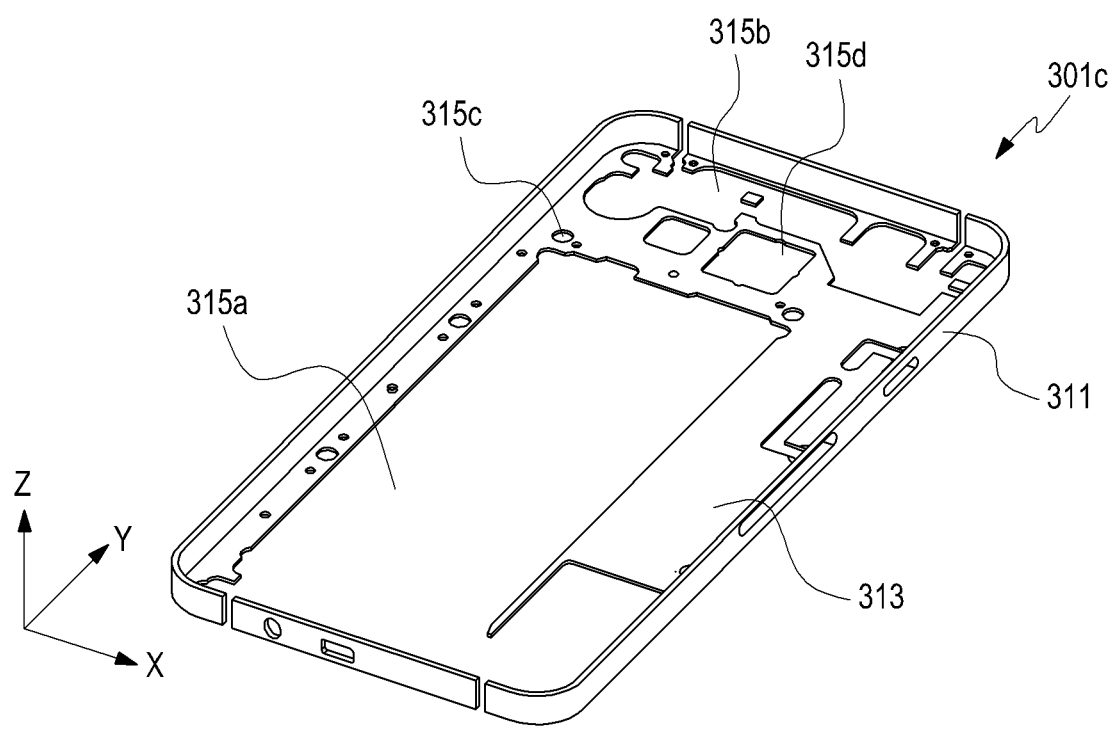
FIG. 3 is a perspective view illustrating a portion of a housing member of the electronic device according to various embodiments.
Figure 4:
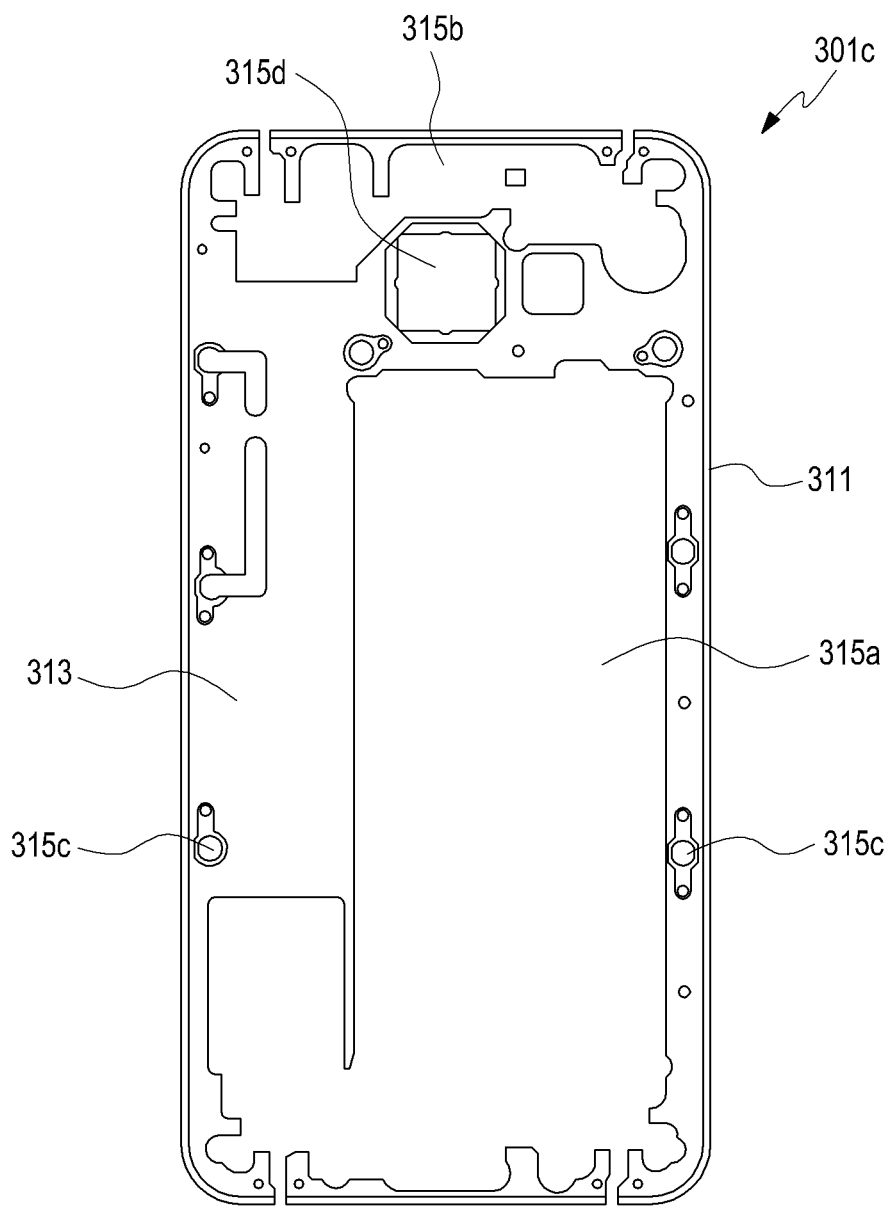
FIG. 4 is a plan view illustrating a portion of a housing member of the electronic device according to various embodiments.

FIG. 3 is a perspective view illustrating a portion of a housing member 301c of the electronic device according to various embodiments. FIG. 4 is a plan view illustrating a portion of the housing member 301c of the electronic device according to various embodiments.

The housing member 301c of the electronic device according to various embodiments may be formed of a combination of a metallic material and a synthetic resin material. For example, an injection-molded structure may be formed in a metallic material portion through a process such as insert injection molding after partially processing the metallic material. It is noted that the structure illustrated in FIGS. 3 and 4 is illustrated in the state in which an injection-molded structure is removed from the housing member 301c of the electronic device according to various embodiments. A housing member in which an injection-molded structure is molded and coupled to a metallic material portion will be described in more detail with reference to FIG. 5 and the like.

Referring to FIGS. 3 and 4, the housing member 301c of the electronic device according to various embodiments may include a side member 311 and an inner structure 313 extending integrally from the side member 311. The side member 311 may have, for example, a frame shape, and the inner structure 313 may include a flat portion extending from the inside of the side member 311. In one embodiment, the inner structure 313 may include openings 315a, 315b, 315c, and 315d formed through the flat portion.

The openings 315a, 315b, 315c, and 315d may be formed to accommodate at least a portion of a battery (e.g., the battery 127 of FIG. 1) (e.g., the opening indicated by reference numeral "315a"), or to cause a portion of the conductive material portion of the side member 311 (e.g., the opening indicated by reference numeral "315b") to be disconnected from the other portion of the conductive material portion. In one embodiment, some of the openings 315a, 315b, 315c, and 315d, for example, the opening indicated by reference numeral 315c may provide a path or means for fastening and fixing the housing member 301c to another structure (e.g., the intermediate plate 125 of FIG. 1). In another embodiment, some other openings of the openings 315a, 315b, 315c, and 315d, or another opening (e.g., the opening indicated by reference numeral "315d") may provide an imaging path of a camera module (e.g., camera module 225 illustrated in FIG. 2).

The number, position, shape, etc. of the openings 315a, 315b, 315c, and 315d may vary in some embodiments. For example, when the electronic device (e.g., the electronic device 200 of FIG. 2) is a mobile communication terminal requiring portability, ten openings for fastening and fixing may be formed. In another embodiment, when the electronic device has a larger size than the mobile communication terminal, such as a vehicle navigation system or a tablet PC, more than ten openings for fastening and fixing may be formed.

Figure 5:
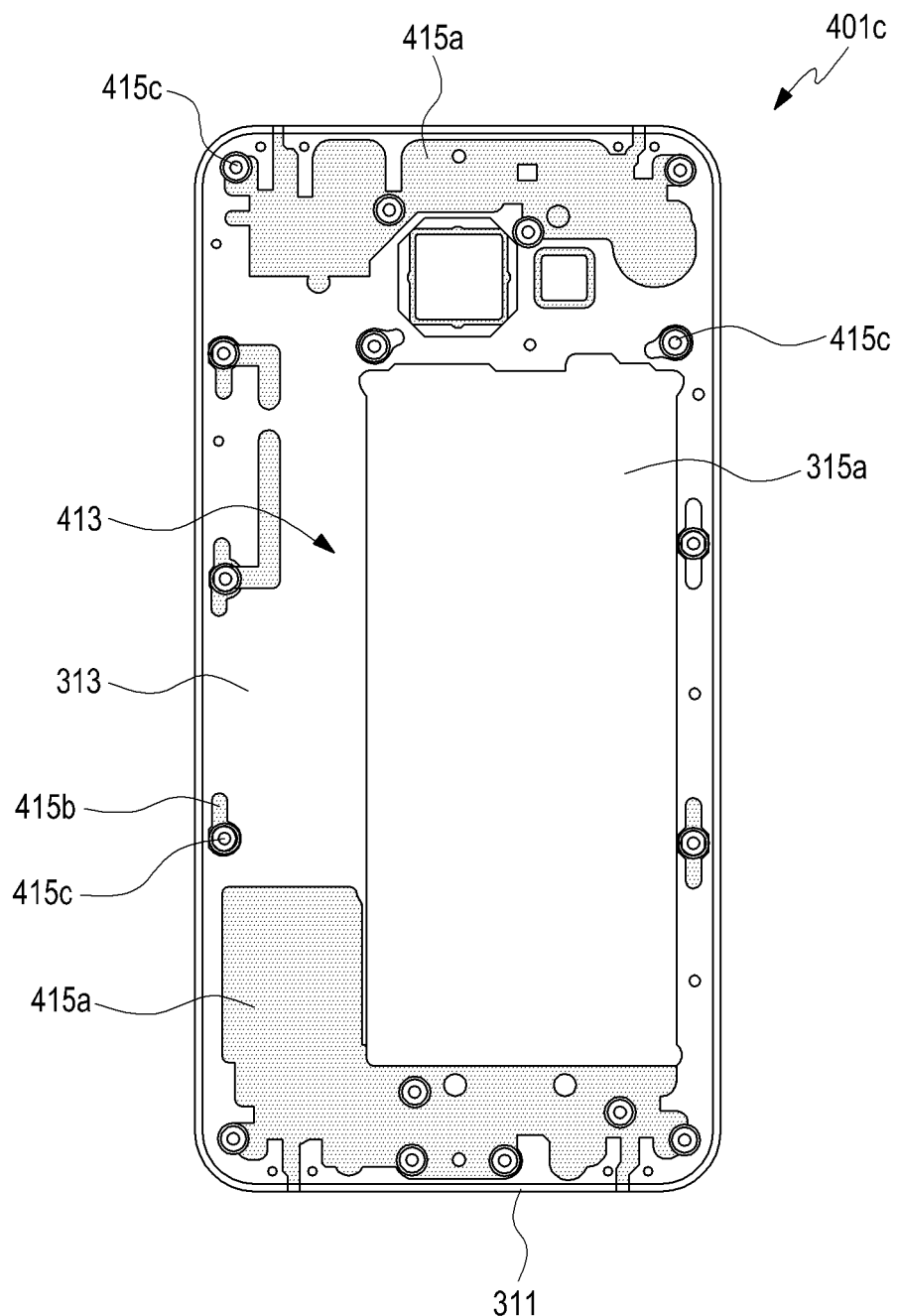
FIG. 5 is a (outer) plan view illustrating a portion of the housing member of the electronic device according to various embodiments.
Figure 6:
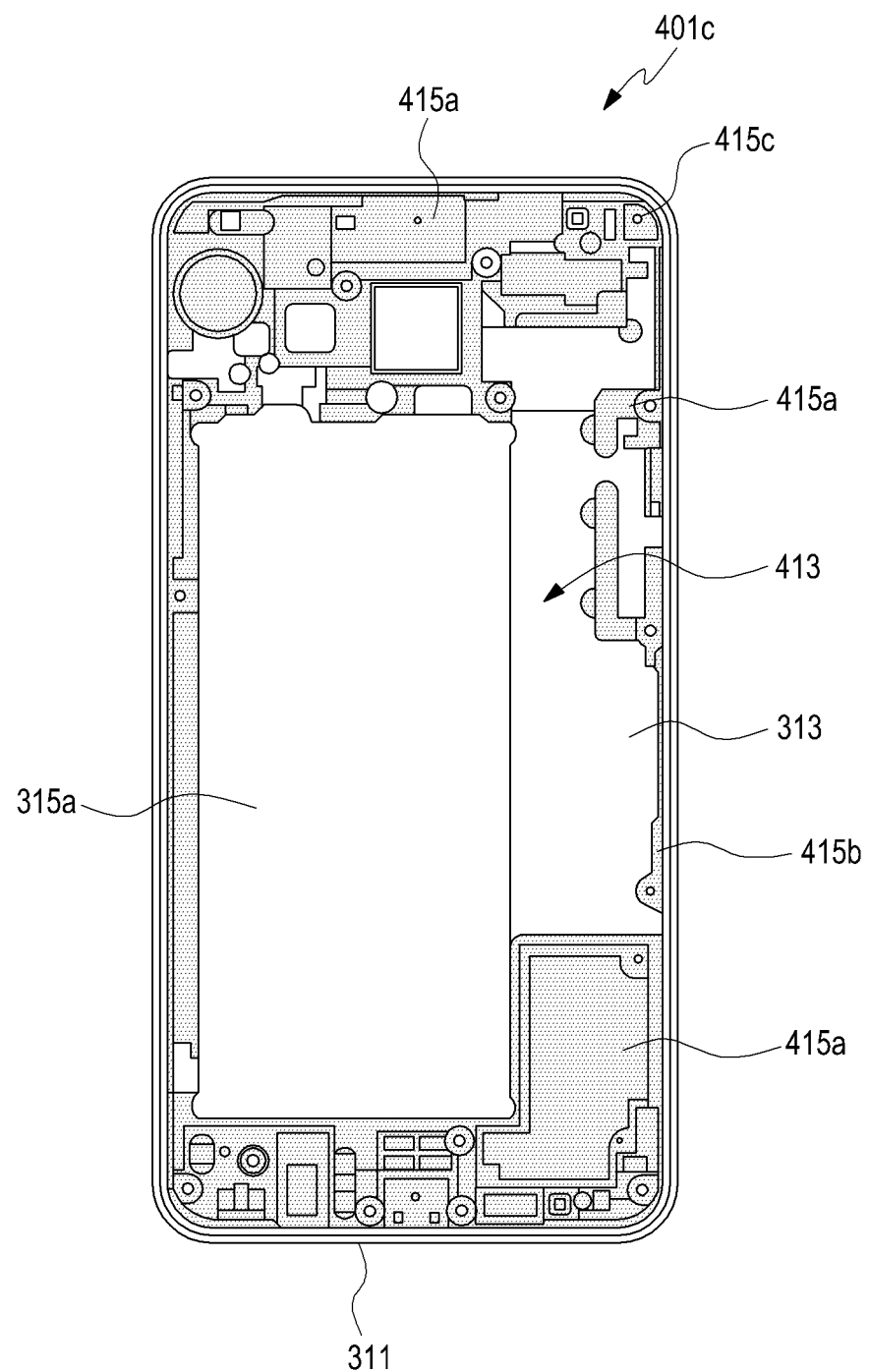
FIG. 6 is a (inner) plan view illustrating a portion of the housing member of the electronic device according to various embodiments.

FIG. 5 is an (outer) plan view illustrating a part of the housing member 401c of the electronic device according to various embodiments. FIG. 6 is a (inner) plan view illustrating a part of the housing member 401c of the electronic device according to various embodiments.

Referring to FIGS. 5 and 6, the housing member 401c may include a synthetic resin material integrally formed on a metallic material portion (e.g., a portion of the housing member 301c illustrated in FIG. 3). For example, the internal structure 413 of the housing member 401c may include a synthetic resin material molded on or bonded to the flat portion 313 through insert injection molding. The synthetic resin material has considerable fluidity at a high temperature and may be useful for forming structures of various shapes (e.g., injection-molded structures 415a and 415b) by being cured to a predetermined shape when cooled. In one embodiment, after the synthetic resin material is molded to, e.g., the injection-molded structures 415a and 415b, some of the openings formed through the flat portion 313 (e.g., the openings indicated by reference numerals 315b' and 315c' in FIG. 3) may be filled with the injection-molded structures 415a and 415b and the other openings (e.g., openings indicated by reference numerals 315a and 315d in FIG. 3) may remain in an open state. In one embodiment, no injection-molded structure is formed in at least a portion of the opening indicated by reference numeral 315a in FIG. 3, and the above-mentioned battery (e.g., the battery 127 of FIG. 1) may be least partially accommodated in a region or space remaining in the open state.

The injection-molded structures 415a and 415b may be formed in the above-described split portions (e.g., the split portions 211 and 215 in FIG. 2) or openings for fastening and fixing (e.g., openings indicated by reference numeral 315c in FIG. 3). For example, the injection-molded structure 415a formed in an opening (e.g., an opening indicated by reference numeral 315b in FIG. 3) for forming the split portions 211 and 215 may electrically insulate the portions (the portions indicated by reference numerals 213 and 217 in FIG. 2) disconnected from the other portions in the metallic material portion while mechanically connecting the disconnected portions and the other portions to each other. In another embodiment, the injection-molded structures 415b formed in the openings for fastening and fixing (e.g., the openings indicated by reference numeral 315c in FIG. 3) may include screw holes 415c extending in the first (Z) direction and/or the second (−Z) direction (e.g., the thickness direction of the internal structure 413 or the flat portion 313) therethrough. For example, a portion of the synthetic resin material molded on or coupled to the flat portion 313 may include fixing bosses.

Hereinafter, a method of manufacturing a housing (e.g., the above-mentioned housing member) of an electronic device according to various embodiments will be described with reference to FIGS. 7 to 16. In the following detailed description, in some embodiments, for components that can be easily understood through the preceding embodiments, reference numerals of the drawings may be identically given or omitted, and detailed descriptions thereof may also be omitted.

Figure 7:
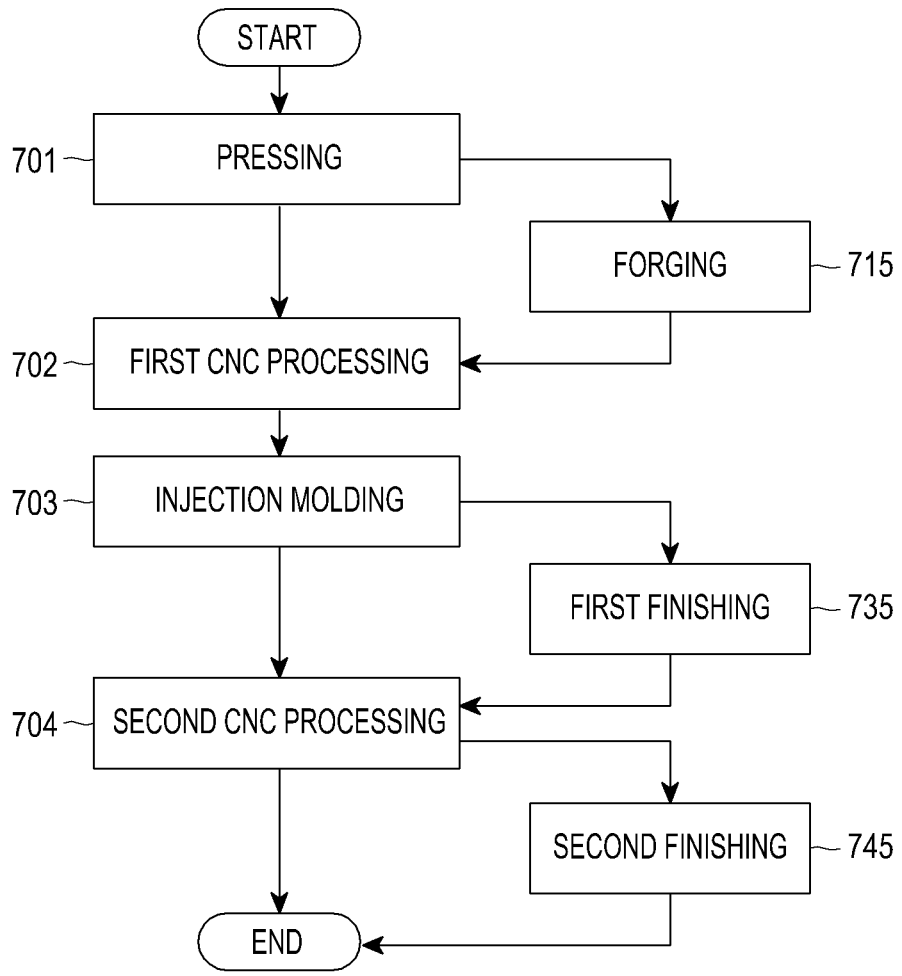
FIG. 7 is a flowchart for describing a method of manufacturing the housing of an electronic device according to various embodiments.

FIG. 7 is a flowchart for describing a method of manufacturing a housing of an electronic device (700) according to various embodiments.

Referring to FIG. 7, a method of manufacturing a housing of an electronic device (700) according to various embodiments may include a pressing operation (701), a first computerized numerical control (CNC) processing operation (702), an injection molding operation (703), and a second CNC processing operation (704), and some embodiments may further include at least one of a forging operation (715), a first finishing operation (735), and a second finishing operation (745).

Figure 8:
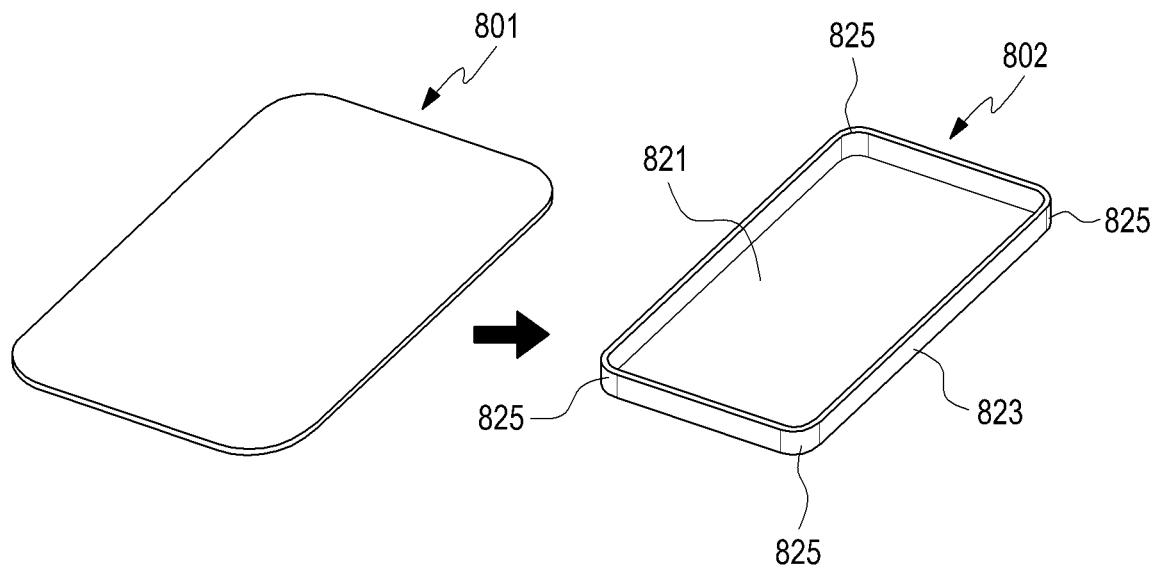
FIG. 8 is a view for describing an operation in which a first workpiece is formed through pressing in a method according to various embodiments.
Figure 9:
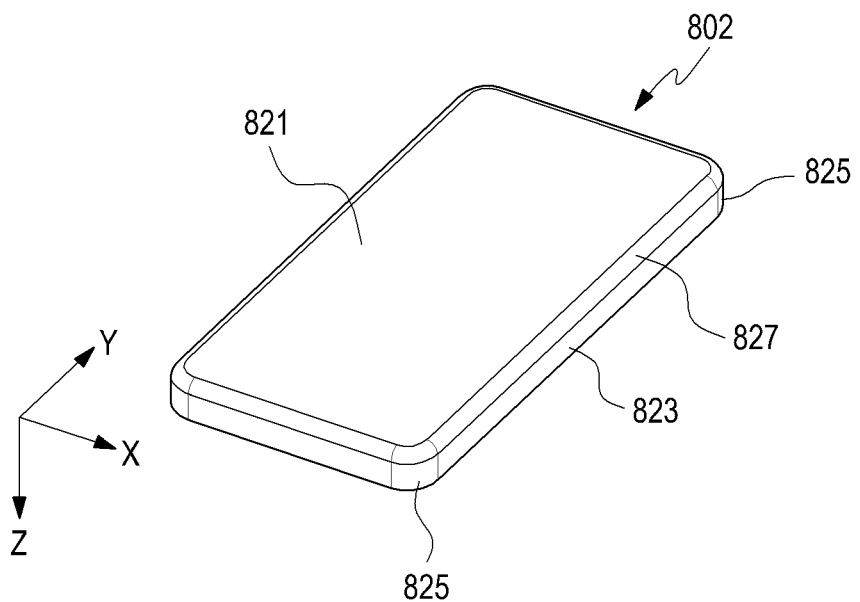
FIG. 9 is a perspective view illustrating the first workpiece formed through pressing in the method according to various embodiments.
Figure 10:
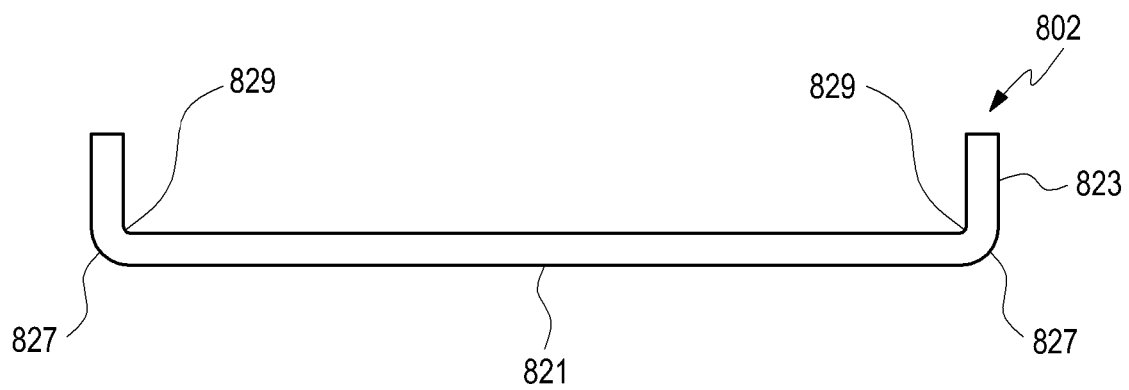
FIG. 10 is a cross-sectional view illustrating the first workpiece formed through pressing in the method according to various embodiments.

FIG. 8 is a view for describing an operation in which a first workpiece 802 is formed through pressing in a method according to various embodiments. FIG. 9 is a perspective view illustrating the first workpiece 802 formed through pressing in the method according to various embodiments. FIG. 10 is a cross-sectional view illustrating the first workpiece 802 formed through pressing in the method according to various embodiments.

Further referring to FIGS. 8 to 10, in the pressing operation (701), the first workpiece 802 may be formed by working a metal sheet or metal plate 801 using a press. The first workpiece 802 has a hexahedron shape with one face is opened, and may include, for example, a bottom plate 821 and a side wall member 823 formed along the edges of the bottom plate 821 so as to form four side walls. First curved portions 827 and 829 may be formed on the outer face and/or inner face of the first workpiece 802 while the edge portions of the metal sheet or the metal plate 801 are bent in the pressing process. For example, the first curved portions 827 and 829 may be formed along the boundary between the bottom plate 821 and the side wall member 823 and may have a closed loop shape surrounding the bottom plate 821. The side wall member 823 may include four straight or flat plate-shaped side walls, and two adjacent side walls may be connected via a second curved portion 825. By connecting the two adjacent side walls of the side wall member 823 via the second curved portion 825, cracking and the like of the side wall member 823 can be prevented, for example, in the operation in which the metal sheet or the metal plate 801 is bent in the pressing operation (701). In one embodiment, at least one pair, e.g., two pairs, of the second curved portions 825 may be disposed, and at least one pair of the second curved portions 825 may be disposed symmetrically with respect to each other.

According to one embodiment, the method (700) may further include the forging operation (715). In the first workpiece 802 formed through the pressing operation, the thicknesses of the bottom plate 821 and the side wall member 823 may be the same as each other. The forging operation 715 may increase the thickness of the side wall member 823 by pressing or impacting the side wall member 823. Referring to FIG. 10, when the upper end of the side wall member 823 is pressed or impacted, the thickness of the side wall member 823 can be increased while the height of the side wall member 823 is decreased. As will be described later, in the first CNC processing operation (702), an opening or the like is formed at least in the bottom plate 821 of the first workpiece 802, and the forging operation performed after forming the opening or the like, may cause deformation of the previously formed opening or the like. According to one embodiment, the forging operation (715) is performed before the first CNC processing operation (702) or the injection molding operation (703), thereby preventing deformation or damage of an opening, an injection-molded structure, or the like.

Figure 11:
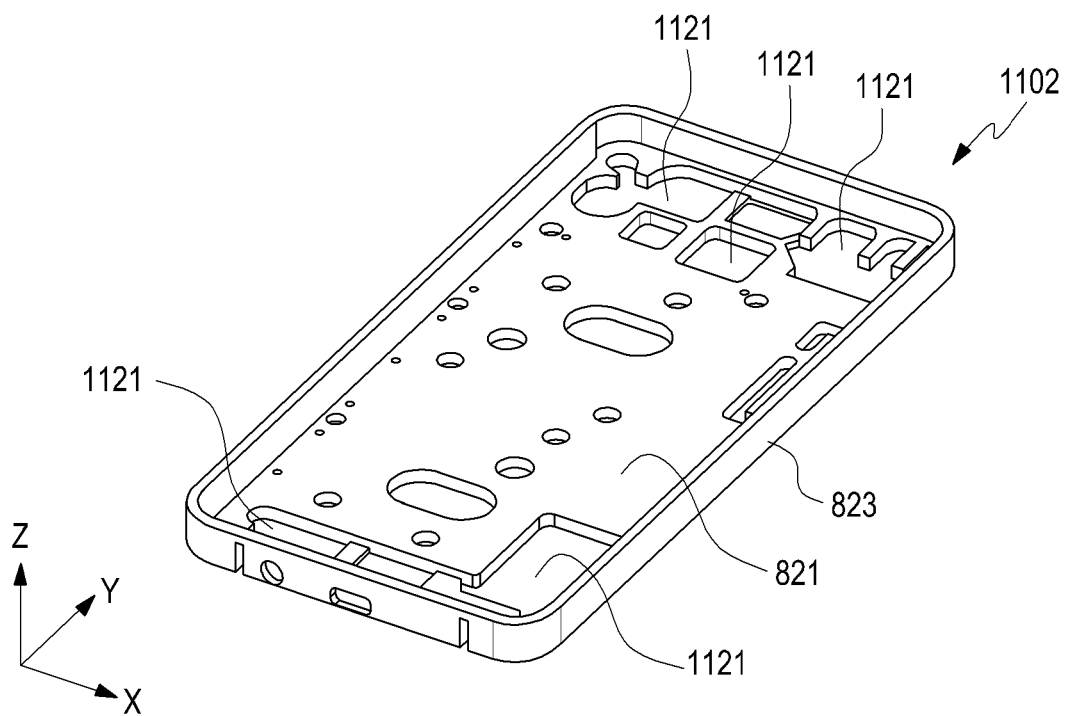
FIG. 11 is a perspective view illustrating a second workpiece formed through first CNC processing in the method according to various embodiments.

FIG. 11 is a perspective view illustrating a second workpiece 1102 formed through first CNC processing in the method according to various embodiments.

Further referring to FIG. 11, the first CNC processing operation (702) may include forming at least one opening 1121 in the first workpiece 802, for example, at least the bottom plate 821, or forming the second workpiece 1102 by cutting at least a part of the bottom plate 821 so as to partially reduce the thickness of the bottom plate 821. According to one embodiment, when the housing member (e.g., the housing member 101c in FIG. 2) of the electronic device includes split portions (e.g., split portions 211 and 215 in FIG. 2), a portion of the second workpiece 1102 may be disconnected from the other portions by the first CNC processing operation (702). A disconnected portion and another portion of the second workpiece 1102 may be mechanically connected through the injection molding operation (703), but may be electrically insulated.

Figure 12:
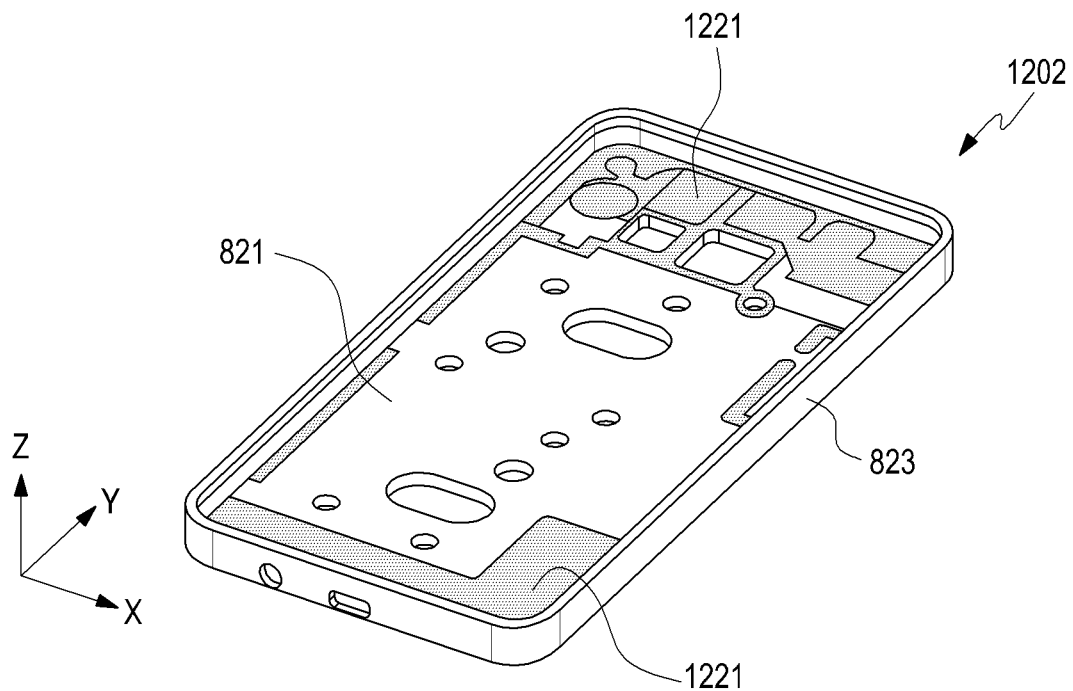
FIG. 12 is a perspective view illustrating a third workpiece formed through injection molding in the method according to various embodiments.
Figure 13:
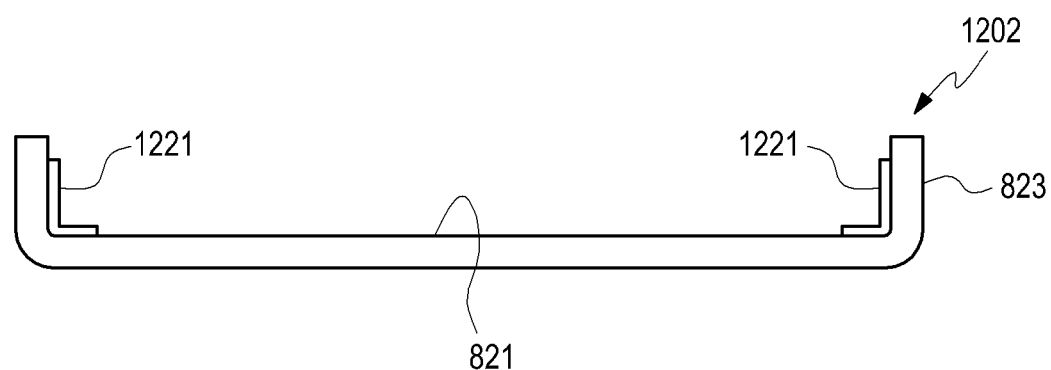
FIG. 13 is a cross-sectional view illustrating the third workpiece formed through injection molding in the method according to various embodiments.

FIG. 12 is a perspective view illustrating a third workpiece 1202 formed through injection molding in the method according to various embodiments. FIG. 13 is a cross-sectional view illustrating the third workpiece 1202 formed through injection molding in the method according to various embodiments.

Further referring to FIGS. 12 and 13, the injection molding operation (703) may include an insert injection molding process. For example, the injection molding operation (703) may be performed by performing injection molding in the state in which the second workpiece 1102 is disposed in a mold, so that it is possible to form the third workpiece 1202 including injection-molded structures 1221 coupled to at least the bottom plate 821. In one embodiment, some of the injection-molded structures 1221 may be formed on the bottom plate 821, some of the injection-molded structures 1221 may be formed on the side wall member 823, and the remaining injection-molded structures may be formed over the bottom plate 821 and the side wall member.

According to one embodiment, the injection-molded structure 1221 may include a first curved portion (e.g., the first curved portion indicated by reference numeral "829" in FIG. 10) formed on the inner face of the second workpiece 1102. The first curved portion 829 may have a different curvature depending on the force applied to the metal sheet or the metal plate 801 in the pressing operation (701), the time, the working temperature, and the like. The injection-molded structure 1221 may be at least partially formed in the first curved portion 829 so as to eliminate such a difference in curvature and to improve the quality of the third workpiece 1202 and/or the above-described housing member (e.g., the housing member 401c in FIG. 5). In another embodiment, the curvatures of the first curved portions 829 and the like may be uniformly formed in the first CNC processing operation (702) and/or the second CNC processing operation (704) to be described later. For example, the structure in which the injection-molded structure 1221 is formed on the first curved portion 829 does not limit the present disclosure, and various methods of making the curvature or the like of the first curved portion 829 uniform may exist.

The injection-molded structures 1221 may mechanically connect, fix, or electrically insulate disconnected portions in the second workpiece 1102. In one embodiment, the injection-molded structures 1221 may provide a fastening structure, such as a fastening boss. In some embodiments, a fastening boss may be formed in the injection molding operation (703), or may be formed through additional CNC processing or the like. For example, the method (700) may further include a first finishing operation (735). In the first finishing operation (735), the injection-molded structures 1221 may be processed according to the design specification and/or the application by partially cutting the injection-molded structure 1221 and so on.

Figure 14:
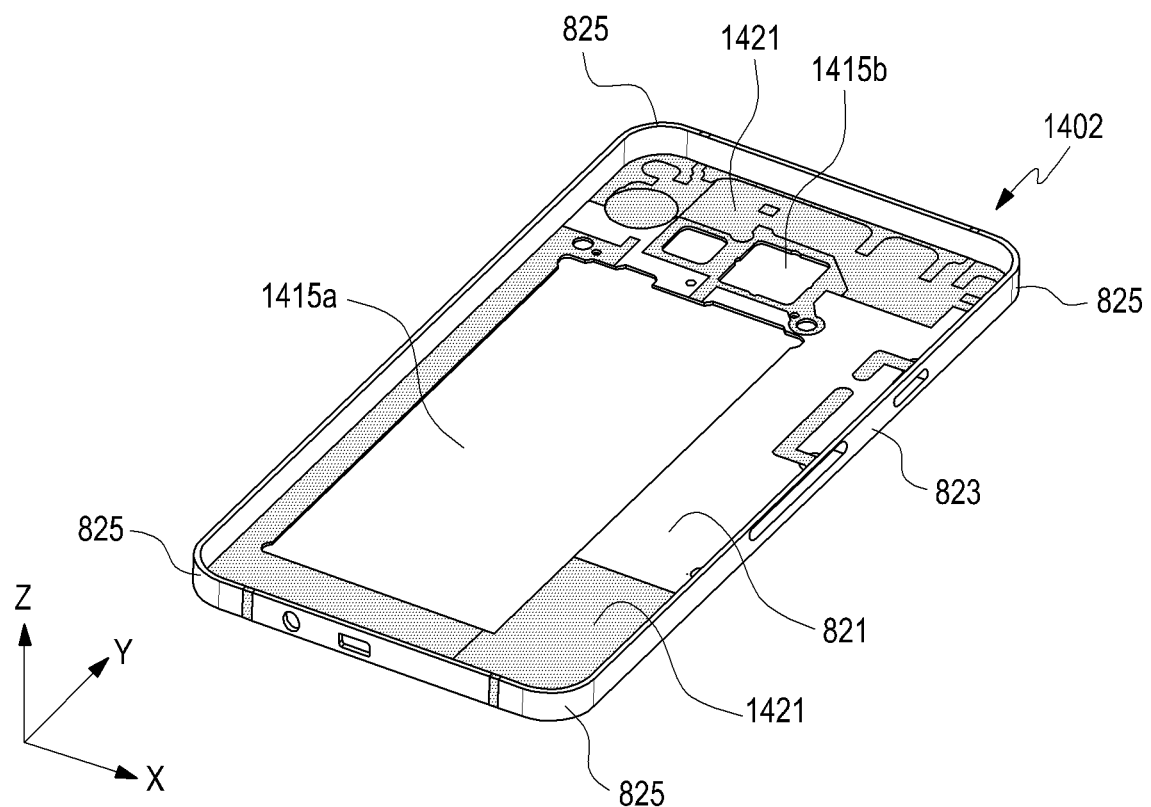
FIG. 14 is a perspective view illustrating a housing member formed through second CNC processing in the method according to various embodiments.
Figure 15:
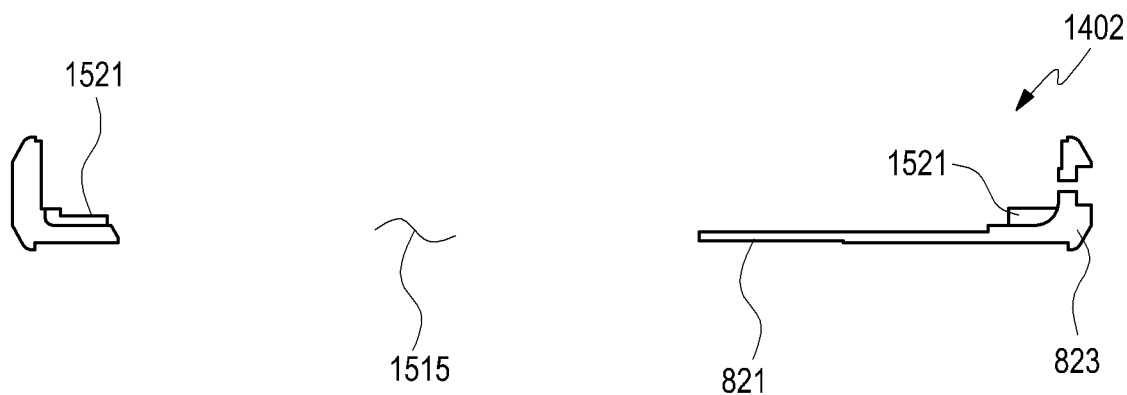
FIGS. 15 and 16 are cross-sectional views each illustrating a housing member formed through second CNC processing in the method according to various embodiments.
Figure 16:
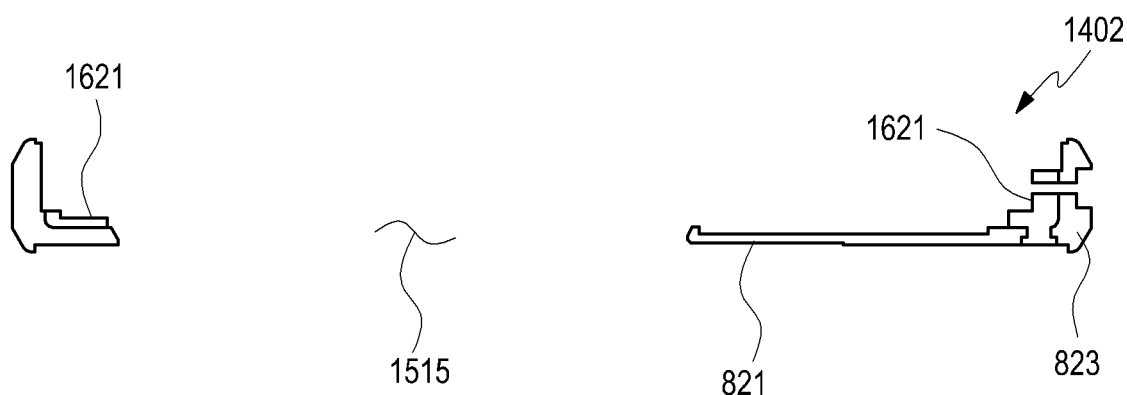

FIG. 14 is a perspective view illustrating a housing member 1402 formed through second CNC processing in the method according to various embodiments. FIGS. 15 and 16 are cross-sectional views each illustrating the housing member 1402 formed through second CNC processing in the method according to various embodiments.

Further referring to FIGS. 14 to 16, in the second CNC processing operation (704), the housing member 1402 (e.g., the housing member 401c in FIG. 5) may be formed by partially cutting the third workpiece 1202 to be suitable for the designation specification of the electronic device. In the second CNC processing operation (704), an openings 1415a or 1515 for accommodating a battery may be formed by cutting the bottom plate 821 of the third workpiece 1202, or holes in which a volume control key (e.g., the volume control key 231 in FIG. 2), a slot cover (e.g., the slot cover 235 in FIG. 2), and the like are disposed may be formed by cutting the side wall member 823 of the third workpiece 1202. In one embodiment, in the second CNC processing operation 704, a partially cut injection-molded structure 1421, 1521, or 1621 may be formed. When the processing of the injection-molded structure is possible in the second CNC processing operation (704), the first finishing operation (735) may be omitted. In another embodiment, the first finishing operation (735) may be a part of the second CNC processing operation (704).

According to one embodiment, the method 700 may further include a second finishing operation (745). The housing member 1402 completed in the second CNC processing operation (704) may exhibit an inherent color of the metallic material in the external appearance thereof. According to one embodiment, when the metallic material is exposed to a high-temperature and high-humidity environment, it may be vulnerable to contamination, corrosion, or the like. In the second finishing operation (745), a surface treatment may be performed on the housing member 1402 completed in the second CNC processing operation (704). For example, when the housing member 1402 is made of an aluminum material, an anodized film may be formed on the surface of the housing member 1402 through an anodizing process. The anodized film formed by the anodizing process can prevent the aluminum material from being exposed to the external environment and can improve the surface hardness of the housing member 1402. Further, the anodized film formed by the anodizing process can be more easily colored than the surface of the aluminum itself, so that the color of the housing member 1402 can be varied.

As described above, in the method of manufacturing a housing (700) according to various embodiments, a housing and/or a housing member of a metallic material can be manufactured through pressing and/or CNC processing, so that it is possible to reduce the manufacturing time and material consumption. For example, it is possible to reduce the amount of material removed by cutting compared with CNC processing from a hexahedral block-shaped metallic material, and as the amount of material to be removed is reduced, it is possible to reduce the cutting time.

Figure 17:
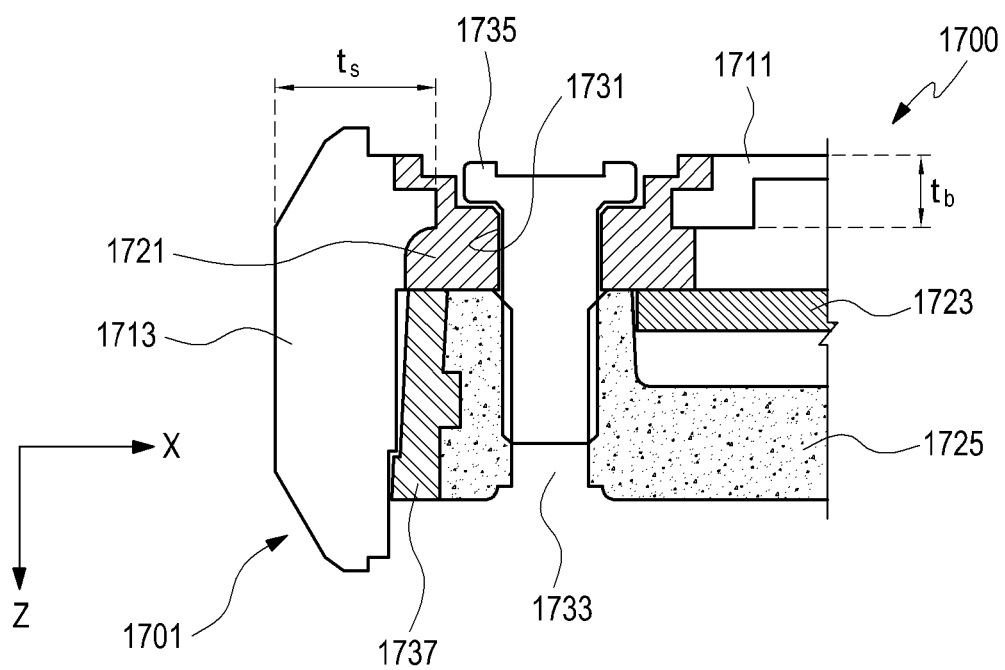
FIG. 17 is a cross-sectional view illustrating the electronic device according to various embodiments of the present disclosure in which a portion of the electronic device is cut away.

FIG. 17 is a cross-sectional view illustrating the electronic device according to various embodiments of the present disclosure in which a portion of the electronic device is cut away.

In FIG. 17, it is noted that some components of the electronic device such as the above-described first plate, second plate, and display (e.g., the first plate 101a, second plate 101b, and display 121 in FIG. 1), are omitted for the sake of conciseness of the drawings and/or detailed description.

Referring to FIG. 17, an electronic device 1700 (e.g., the electronic device 100 of FIG. 1) may include a housing member 1701. The housing member 1701 may include a side member 1713 at least partially surrounding a space between the first and second plates (e.g., the first and second plates 101a and 101b of FIG. 1) and an inner structure, for example, a flat portion 1711, extending from the side member 1713. In one embodiment, the housing member 1701 may include a synthetic resin member, e.g., an injection-molded structure 1721, disposed in an opening formed through the flat portion 1711. The injection-molded structure 1721 may include a screw hole 1731 extending therethrough in a first (Z) direction. For example, the injection-molded structure 1721 may be used as a fastening boss.

The electronic device 1700 may include an intermediate plate 1725 accommodated in the space surrounded by the side member 1713 and at least partially facing the flat portion 1711, and a printed circuit board 1723 may be mounted between the flat portion 1711 and the intermediate plate 1725. The intermediate plate 1725 may include a through hole 1733 extending in the first (Z) direction, and when the intermediate plate 1725 is disposed to face the plane portion 1711, the through hole 1733 may be aligned with the screw hole 1731. In one embodiment, when the screw 1735 is fastened to the through hole 1733 through the screw hole 1731, the intermediate plate 1725 can be fixed to the inner structure (e.g., the flat portion 1711 of the housing member 1701). According to various embodiments, the housing member 1701 may include a plurality of fastening bosses in a part of the injection structure 1721, and some fastening bosses may be utilized to fix the printed circuit board 1723.

In another embodiment, a dummy member 1737 may be provided between the intermediate plate 1725 and the side member 1713. The dummy member 1737 firmly fixes the side member 1713 and the intermediate plate 1725 to each other, thereby improving structural stability, ease of assembly, and the like. For example, even if an external force is applied to the outer face of the side member 1713 in a third direction (e.g., the X direction) perpendicular to the first (Z) direction, the dummy member 1737 and the intermediate plate 1735 are able to support the side member 1713, thereby preventing deformation or the like of the side member 1713.

According to one embodiment, the thickness tb of the inner structure, for example, the flat portion 1711 may be smaller than the thickness is of the side member 1713. For example, the housing member 1701 is manufactured by pressing a metal sheet or a metal plate having a substantially uniform thickness. However, as the metal sheet or the like is partially cut through the CNC processing operation or the like, the thickness of the side member 1713 may be the same as or larger than the thickness of the flat portion 1711.

As described above, an electronic device according to various embodiments may include:

a housing including a first plate facing in a first direction, a second plate facing in a second direction opposite the first direction, and a side member having a first thickness in a third direction perpendicular to the first direction, while at least partially enclosing a space between the first plate and the second plate;

a display disposed between the first plate and the second plate within the housing;

a printed circuit board disposed between the display and the second plate within the housing; and an inner structure disposed between the printed circuit board and the second plate within the housing while having a second thickness in the first direction.

The inner structure may include a flat portion extending from the side member and made of the same metal material as the side member, and the maximum value of the first thickness may be greater than the maximum value of the second thickness.

According to various embodiments, the electronic device may further include a battery and the inner structure may further include an opening that is formed through the flat portion to at least partially accommodate the battery.

According to various embodiments, the inner structure may further include a synthetic resin material coupled to the flat portion.

According to various embodiments, at least a portion of the synthetic resin material may be located between the printed circuit board and the flat portion.

According to various embodiments, the synthetic resin material may form a fastening boss.

According to various embodiments, the electronic device may further include an intermediate plate between the printed circuit board and the display, and the intermediate plate may be coupled to the inner structure through the fastening boss.

According to various embodiments, the side member may include at least a pair of curved portions disposed symmetrical to each other.

According to various embodiments, an electronic device may include:

a housing including a first plate facing in a first direction, a second plate facing in a second direction opposite the first direction, and a side member at least partially surrounding a space between the first plate and the second plate;

a display disposed between the first plate and the second plate within the housing;

a printed circuit board disposed between the display and the second plate within the housing; and an inner structure disposed between the printed circuit board and the second plate within the housing while having a second thickness in the first direction.

The inner structure may include a first portion extending from the side member and made of the same metallic material as the side member, a plurality of openings formed through the first portion, and a synthetic resin member disposed in at least one of the openings.

The synthetic resin member may include a screw hole extending in the first direction.

According to various embodiments, the electronic device may further include a screw engaged in the screw hole, and an intermediate plate disposed between the printed circuit board and the display within the housing, the intermediate plate may further include a through hole extending in the first direction and aligned with the screw hole, and the screw may be fixed to the through hole to fix the intermediate plate to the inner structure.

According to various embodiments, the method of manufacturing a housing of an electronic device may include:

a pressing operation for forming a first workpiece including a bottom plate and a side wall member formed on an edge of the bottom plate by processing a metal sheet or a metal plate using a press;

a first computerized numerical control (CNC) processing operation for forming a second workpiece by removing a part of a metallic material constituting the first workpiece;

an injection molding operation for forming a third workpiece by forming an injection-molded structure on the second workpiece through insert injection molding; and a second CNC processing operation for forming a housing member by removing a part of the metallic material constituting the third workpiece.

The side wall of the housing member, which is formed by the side wall member, may be formed to have a thickness, which is the same as a thickness of a flat portion of the housing member formed by processing the bottom plate and is larger than a thickness of the flat portion.

According to various embodiments, the method may further include a forging operation for increasing the thickness of the side wall member by pressing or impacting an upper end of the side wall member after forming the first workpiece.

According to various embodiments, the method may further include a first finishing operation for removing a part of a synthetic resin constituting the injection-molded structure after the injection molding operation.

According to various embodiments, the method may further include a second finishing operation for anodizing a surface of the housing member after the second CNC processing operation.

According to various embodiments, in the pressing operation, in an outer face or an inner face of the first workpiece, a first curved portion may be formed in a circumference of the bottom plate.

According to various embodiments, the first curved portion may be formed to have a closed loop shape enclosing the bottom plate.

According to various embodiments, in the first CNC processing operation, at least one opening may be formed in the bottom plate of the second workpiece, and at least a part of the injection-molded structure is formed inside the opening.

According to various embodiments, the injection-molded structure may be formed to include a fastening boss.

According to various embodiments, after the second CNC processing operation, the side wall member of the housing member may be formed to be thicker than the bottom plate.

According to various embodiments, in the pressing operation, the first workpiece may be formed to include at least one pair of second curved portions disposed to be symmetrical to each other as a portion of the side wall member.

According to various embodiments, in the pressing operation, in an inner face of the first workpiece, a first curved portion may be formed in a circumference of the bottom plate, and the injection-molded structure may be formed to conceal the first curved portion.

While the present disclosure has been shown and described with reference to certain embodiments thereof, it will be understood by those skilled in the art that various changes in form and details may be made therein without departing from the spirit and scope of the present disclosure as defined by the appended claims.

The invention claimed is:

1. An electronic device comprising:
a housing comprising a first plate, a second plate, and a side member arranged between the first plate and the second plate to at least partially enclose a space between the first plate and the second plate;
a display disposed within the housing between the first plate and the second plate;
a printed circuit board disposed within the housing between the display and the second plate; and
an inner structure disposed within the housing between the printed circuit board and the second plate,
wherein the inner structure comprises a flat portion extending from the side member into the space between the first plate and the second plate, the inner structure comprising a same metallic material as the side member,
wherein a thickness of the side member has a maximum value greater than a maximum value of a thickness of the inner structure, and
wherein the inner structure is formed integrally with the side member through pressing and CNC processing of a metal sheet and/or a metal plate.

2. The electronic device of claim 1, further comprising a battery at least partially accommodated in an opening in the flat portion of the inner structure.

3. The electronic device of claim 1, wherein the inner structure further comprises a synthetic resin material.

4. The electronic device of claim 3, wherein at least a portion of the synthetic resin material is disposed between the printed circuit board and the flat portion of the inner structure.

5. The electronic device of claim 3, wherein the synthetic resin material comprises a fastening boss.

6. The electronic device of claim 5, further comprising an intermediate plate disposed between the printed circuit board and the display,
wherein the intermediate plate is coupled to the inner structure through the fastening boss.

7. The electronic device of claim 1, wherein the side member comprises at least a pair of curved portions symmetrically disposed relative to each other.

8. The electronic device of claim 1, wherein the inner structure comprises a plurality of openings formed through the flat portion, and a synthetic resin member disposed in at least one of the openings, and
the synthetic resin member comprises a screw hole.

9. The electronic device of claim 8, further comprising a screw engaging the screw hole, and an intermediate plate disposed within the housing between the printed circuit board and the display,
wherein the intermediate plate further includes a through hole aligned with the screw hole, and
wherein the screw engages the through hole to fix the intermediate plate to the inner structure.

* * * * *